United States Patent [19]

Narayanswami et al.

[11] Patent Number: 5,810,942
[45] Date of Patent: Sep. 22, 1998

[54] AERODYNAMIC AEROSOL CHAMBER

[75] Inventors: Natraj Narayanswami; Thomas J. Wagener, both of Eden Prairie; Kevin L. Siefering, Chaska, all of Minn.; William A. Cavaliere, Dutchess, N.Y.

[73] Assignee: FSI International, Inc., Chaska, Minn.

[21] Appl. No.: 712,342

[22] Filed: Sep. 11, 1996

[51] Int. Cl.$^6$ ....................................................... B08B 3/00
[52] U.S. Cl. ............................... 134/7; 134/30; 134/60; 134/85; 134/86; 134/104.3; 134/177
[58] Field of Search ..................... 134/7, 30, 60, 134/85, 86, 104.3, 177

[56] References Cited

U.S. PATENT DOCUMENTS

| | | | |
|---|---|---|---|
| 4,747,421 | 5/1988 | Hayashi | 134/201 |
| 4,806,171 | 2/1989 | Whitlock et al. | 134/7 |
| 4,936,922 | 6/1990 | Cherry | 134/22.18 |
| 4,952,299 | 8/1990 | Chrisos et al. | 204/298.25 |
| 4,962,891 | 10/1990 | Layden | 239/597 |
| 4,974,375 | 12/1990 | Tada et al. | 51/413 |
| 5,009,240 | 4/1991 | Levi | 134/7 |
| 5,025,597 | 6/1991 | Tada et al. | 51/410 |
| 5,062,898 | 11/1991 | McDermott et al. | 134/7 |
| 5,129,956 | 7/1992 | Pickering et al. | 134/15 |
| 5,209,028 | 5/1993 | McDermott et al. | 51/426 |
| 5,217,925 | 6/1993 | Ogawa et al. | 437/225 |
| 5,294,261 | 3/1994 | McDermott et al. | 134/7 |
| 5,366,156 | 11/1994 | Bauer et al. | 239/135 |
| 5,372,652 | 12/1994 | Srikrishnan et al. | 134/7 |
| 5,377,911 | 1/1995 | Bauer et al. | 239/135 |
| 5,378,312 | 1/1995 | Gifford et al. | 38/695 |
| 5,456,758 | 10/1995 | Menon | 134/33 |
| 5,486,132 | 1/1996 | Cavaliere et al. | 51/410 |
| 5,555,902 | 9/1996 | Menon | 134/199 |

FOREIGN PATENT DOCUMENTS 0 633 443 A1  11/1995  European Pat. Off. .

*Primary Examiner*—Kriellion S. Morgan
*Attorney, Agent, or Firm*—Faegre & Benson LLP

[57] ABSTRACT

An aerosol cleaning apparatus and a method of treating a substrate within such an apparatus prevent contaminant recirculation by controlling the post-impingement exhaust flow through control of the aerodynamic behavior of the contaminant laden exhaust stream. By the present invention, the post-impingement exhaust flow is divided into two streams. A first stream is the main stream flowing initially over the contaminated side of the wafer and carrying most of the suspended contaminants into the exhaust. The second stream flows initially over the cleaned side of the wafer and eventually into the exhaust stream. A flow separator is provided for dividing the post-impingement aerosol spray into plural flow streams. Additionally, the aerosol chamber can advantageously include a shroud positioned within the aerosol chamber just to the side of the nozzle but further away from the exhaust than the nozzle for restricting flow from the second post-impingement stream around the nozzle and into the first post-impingement stream. In accordance with a preferred embodiment, the apparatus is designed for cleaning the surface of a semiconductor wafer by impinging the surface with a cryogenic aerosol spray.

30 Claims, 3 Drawing Sheets

AERODYNAMIC AEROSOL CHAMBER

FIELD OF THE INVENTION

The present invention is directed to an apparatus and method for controlling the aerodynamic behavior of an aerosol jet stream used to process a solid surface provided within a processing chamber. More specifically, the present invention is directed to an aerosol chamber and the processing of a solid surface, such as a silicon wafer, for cleaning a contaminated surface while maximizing contaminant particle removal efficiency. The present invention also applies to the coating of a surface for improving even particle deposition.

BACKGROUND OF THE INVENTION

The present invention has been developed for its particular applicability to the semi-conductor industry, and in particular to the cleaning of contaminated silicon wafers. Many methods have been developed to clean such surfaces. Techniques include the use of solvents or chemical cleaning for removing contaminant films from surfaces, the use of high energy sonic waves, and combinations thereof. Solvents for chemicals may be applied as gas jets or liquid spray. Yet another recently developed technique uses carbon dioxide aerosol blasted against contaminated surfaces. Under a controlled cooling process, solid carbon dioxide particles are generated to hit the contaminated surface.

More recently, cryogenic aerosols have been developed for jet spraying against surfaces, particularly within the semi-conductor wafer industry for particulate decontamination. Cryogens that have been used for removal of particulate contamination include argon, carbon dioxide and water. The idea behind cryogenic aerosols is to provide a jet of frozen particles traveling at subsonic or supersonic speeds. The size of the particles depends on the thermodynamic conditions including the pressure, temperature, flow and the particle forming technique which depends largely on the initial phase of the supplied substance and the nozzle designed. As noted above, carbon dioxide and water have been used in certain applications; however, silicon wafer cleaning requires high purity and the ability not to damage the surface of the silicon wafer. Thus, argon aerosol now seems particularly useful for semiconductor wafer cleaning. For example, U.S. Pat. Nos. 5,062,898, 5,209,028, and 5,294,261, all to McDermott et al disclose the use of cryogenic aerosols which may include argon combined with nitrogen. U.S. Pat. Nos. 4,747,421 to Hayashi and 4,806,171 to Whitlock et al describe apparatuses for cleaning substrates using carbon dioxide aerosol particles.

Although the systems have proved effective in removing particles from contaminated silicon wafers, a problem has been discovered in the cleaning process whereby particles that have been removed from a substrate sometimes recontaminate cleaned surfaces of the substrate. It has been discovered that such recontamination happens as a result of the flow pattern of the aerosol and its exhaust stream within the cleaning chamber of such a cryogenic aerosol cleaning apparatus. The impingement of the aerosol jet stream upon the contaminated wafer knocks contaminants from the wafer surface. As a consequence, the contaminants are suspended in the jet stream and are removed from the processing chamber through an exhaust duct along with aerosol flow. The potential problem of any chamber in which this cleaning process is to be performed is the undesirable redirection or recirculation of a part of the contaminated outflow jet stream back towards the cleaned wafer. This recirculation of contaminated outflow jet stream may result in the consequent redeposition of contaminated particles onto the cleaned portion of the wafer. This recontamination phenomenon can render the wafer practically useless for the manufacture of semiconductor devices in which the typical feature (e.g. the width of a circuit) might be comparable in size to the contaminant particle.

A simple schematic of a cryogenic aerosol cleaning system and a schematic of a cryogenic aerosol cleaning chamber are illustrated in FIGS. 1 and 2, respectively. Illustrated in FIG. 1 is a silicon wafer surface 1 and a jet impingement nozzle 2. Nozzle 2 includes a plurality of orifices along its length from which the aerosol jet spray is propelled toward the silicon wafer surface 1. Typically, the orifices are configured so that the aerosol jet stream impinges the silicon wafer surface 1 at a predetermined angle. The aerosol contains aerosol particles 3 which are suspended within the aerosol gas illustrated by the lines extending from the nozzle to across the silicon wafer surface 1 and from the silicon wafer surface 1 at the arrowheads. Contamination particles 4 are illustrated on the silicon wafer surface 1 and are also shown being carried away by the aerosol gas jet stream from the silicon wafer surface 1. Typically, the jet impingement nozzle 2 is fixed in position and at a specific angle so that the aerosol jet stream including the aerosol particles 3 impinge the silicon wafer surface 1 which is supported to be movable relative to the fixed position of the jet impingement nozzle 2. Usually, the silicon wafer having the surface 1 is mounted in a manner so that it can translate below the jet impingement nozzle 2 so that the entire silicon wafer surface 1 can be cleaned. Aerosol particles 3 carried in the aerosol gas impinge the surface of the silicon wafer 1, cause the removal of the contaminant particles 4, and the jet stream carries the contaminant particles 4 away from the silicon wafer surface 1. As described above, the aerosol may comprise cryogenic aerosol clusters as the aerosol particles 3 or any of the other particles or liquids known for cleaning. Movement of the silicon wafer 1 is controlled to be opposite in direction than the horizontal component of the jet impingement stream to maximize the relative impact velocity between the aerosol and the contaminant particles.

FIG. 2 shows conceptually the incorporation of the basic scheme of FIG. 1 into an aerosol cleaning chamber. Illustrated is a cleaning chamber 5 comprised of sidewalls, a bottom wall, an upper wall, and endwalls. At the end of the cleaning chamber 5 in the direction of the horizontal component of the aerosol jet stream, an exhaust duct 6 is provided. Within the cleaning chamber 5, the jet impingement nozzle 2 is fixed in position and at a specific jet impingement angle. The silicon wafer having surface 1 is shown supported by a chuck 7 which is movable along the longitudinal direction of the cleaning chamber 5 so that the silicon wafer surface 1 can be translated below the jet impingement nozzle 2 for cleaning of the entire wafer surface 1.

In operation, aerosol including aerosol particles 3 and aerosol gas are provided from the jet impingement nozzle 2 through its orifices to impinge the surfaces of silicon wafer 1. The cleaning operation begins with the leading edge of the silicon wafer 1 in position to be impinged, or soon to be impinged, by the aerosol stream. The chuck 7 is then moved at a predetermined rate so that the entire silicon wafer surface 1 can be cleaned. FIG. 2 illustrates a cleaning process with the wafer having a portion cleaned of contaminant particles but still in the process of cleaning the remainder of the wafer surface 1. After the contaminant particles 4 are removed from the silicon wafer surface 1, they are carried by the aerosol jet stream primarily into the exhaust duct 6. However, contaminant recirculation can occur whereby removed contaminant particles 4A may be carried by a secondary air stream that moves around and under the chuck 7 and back to the leading edge of the silicon wafer 1 which has been previously cleaned. The secondary air stream may be caused by recirculating flow based on the design of the cleaning chamber 5, but may also occur because of the generation of a low pressure area X located behind the jet impingement nozzle 2. It is the local action of the jet impingement aerosol stream that causes the low pressure area X and which at least partially generates the secondary air stream carrying the contaminants back to the leading surface of the silicon wafer surface 1. Another phenomenon which occurs results from the jet impingement aerosol stream as it exits the nozzle. Some of the jet aerosol stream flows beneath the nozzle toward the leading edge of the silicon wafer surface 1 that has already passed the nozzle 2. There is a tendency for this aerosol to pass under the jet impingement nozzle 1, then to flow behind and over the jet impingement nozzle 2 and back into the primary exhaust stream. This phenomenon also contributes to the formation of the low pressure area X. This low pressure creates the possibility for a portion of the contaminant laden aerosol of the primary exhaust stream to be drawn under the nozzle 2 onto the clean side of the wafer. Clearly, the problem which has been discovered is the possible recontamination of the cleaned surface of the silicon wafer surface 1 caused by this secondary air stream with contaminant particles.

An example similar to the conceptual drawing of FIG. 2 is described in the McDermott et al U.S. Pat. No. 5,209,028. As described in the McDermott et al reference, a fixed nozzle head is provided to expel aerosol against the surface of a wafer which is supported on an element which is movable along a track by an actuation rod. The housing includes an exit port through which the aerosol with contaminant particles can exit. The nozzle is provided within an upper chamber which connects with a lower chamber. Included at the intersection between the upper and lower chambers, baffle plates and are provided and may be adjusted to open and close the effective aperture through which the nozzle passes to contact and impinge on the wafer to be cleaned. These baffles are designed to avoid recontamination of the wafer and to isolate currents in the upper chamber from participation in the fluid dynamics of the lower chamber.

SUMMARY OF THE PRESENT INVENTION

The present invention overcomes the disadvantages and shortcomings of the prior art by providing an aerosol cleaning apparatus and a method of treating a substrate within such an apparatus wherein contaminant recirculation is prevented by controlling the post-impingement exhaust flow. The present invention minimizes the potential problem of flow recirculation and wafer recontamination in the processing chamber of the cleaning apparatus through control of the aerodynamic behavior of the contaminant laden exhaust stream and to thereby preserve the usefulness of the wafer for semiconductor device manufacture. By the present invention, the post-impingement exhaust flow is divided into two streams. A first stream is the main stream flowing initially over the contaminated side of the wafer and carrying most of the suspended contaminants into the exhaust. The second stream flows initially over the cleaned side of the wafer and eventually into the exhaust stream.

The present invention is advantageous in that it substantially prevents undesirable recontamination of the process surface by controlling flow recirculation. Moreover, other aspects of the processing procedure are improved. By the present invention, the angle of impingement of the jet can be controlled. This angle of impingement of the aerosol jet is critical to the speed of impact effectiveness of the aerosol and therefore critical to contaminant particle removal efficiency. With only a single outflow stream, the angle of impingement is limited to angles less than 90 degrees. With the present invention, the angle of impingement can be extended to 90 degrees or even greater.

The above advantages of the present invention are achieved by an apparatus for treating the surface of an object by impinging the surface with an aerosol spray, wherein the apparatus includes an aerosol chamber having a nozzle supported within the aerosol chamber from which aerosol spray is to be directed against the surface of the object, and a chuck provided within the aerosol chamber for supporting the object with a surface thereof in a position for treatment. The chuck and the nozzle are relatively movable with respect to one another in order to permit impingement over an area of the surface of the object. An exhaust is also provided from the aerosol chamber through which post-impingement aerosol spray can exit. Furthermore, a means is provided for dividing the post-impingement aerosol spray into plural flow streams so that during the treatment of the area of the surface of the object, at least at some point, a first post-impingement stream flows over a portion of the surface yet to be treated, while a second post-impingement stream flows over a portion of the surface already having been treated. Preferably, the means for dividing the post-impingement aerosol spray comprises a flow separator plate that extends from a point adjacent to the chuck toward the exhaust. The chuck is preferably movable within the aerosol chamber but may move linearly or rotationally. Both of the first and second post-impingement streams may flow within a single exhaust duct as directed by the flow separator, which preferably extends within the exhaust duct over at least a portion of the movement of the chuck. Additionally, the aerosol chamber can advantageously include a shroud positioned within the aerosol chamber just to the side of the nozzle but further away from the exhaust than the nozzle for restricting flow from the second post-impingement stream around the nozzle and into the first post-impingement stream.

In accordance with a preferred embodiment, the apparatus is designed for cleaning the surface of a semiconductor wafer by impinging the surface with a cryogenic aerosol spray. Any of the above-noted cryogens can be used depending on the application. However, the present invention is applicable to other aerosol treatments including other types of cleaners and coatings.

In accordance with another aspect of the present invention, a method of treating a surface of an object by jet impingement with an aerosol includes supporting the object within an aerosol chamber of the type including a jet impingement nozzle and a chuck that are relatively movable with respect to one another, and an exhaust from the aerosol chamber through which post-impingement aerosol can exit the aerosol chamber. The method further includes supplying the treatment substance to the nozzle, spraying an aerosol jet stream from the nozzle and impinging the aerosol jet stream against the surface of the object. By moving either the chuck or the nozzle, an area over at least a portion of the surface of the object is treated by aerosol jet impingement. While treating this area the post-impingement aerosol flow is divided into a first post-impingement stream that flows over a portion of the surface of the object yet to be treated and a second post-impingement stream that flows over a portion of the surface already having been treated. Preferably, the step of dividing the post-impingement aerosol flow comprises providing a flow separator plate that extends from a point adjacent to the chuck toward the exhaust. Optionally, the method includes the provision of a shroud for restricting flow of aerosol from the second post-impingement stream around the nozzle and into the first post-impingement stream. Such a shroud can be positioned within the aerosol chamber in a position to the side of the nozzle but further away from the exhaust than the nozzle.

In accordance with a preferred method, the method comprises the cleaning of a semiconductor wafer supported by the chuck within the aerosol chamber by spraying a cryogenic cleaning aerosol jet stream over the entire surface of the semiconductor wafer.

DETAILED DESCRIPTION OF THE PREFERRED EMBODIMENTS

Figure 3:
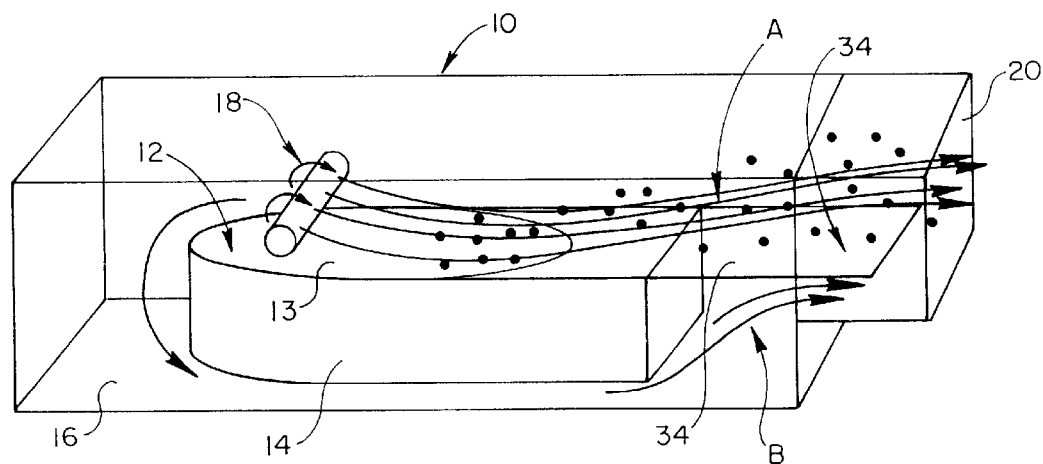
FIG. 3 is a schematic view in perspective in accordance with the present invention of an aerosol chamber with forced separation of the posed impingement outflow into two separate streams.
Figure 5:
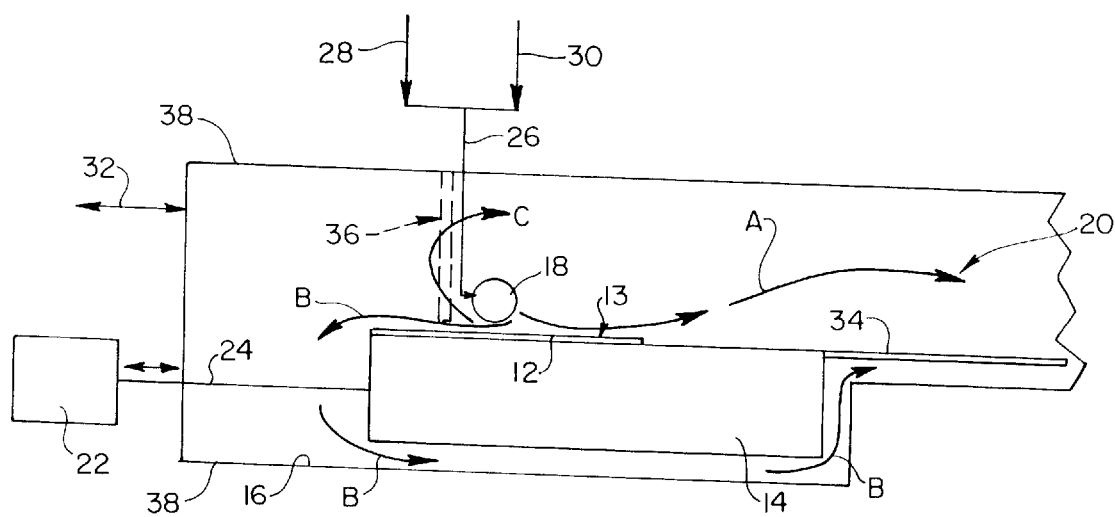
FIG. 5 is a side schematic view of an aerosol chamber with split post-impingement outflow.

With reference to the Figures, and initially to FIGS. 3 and 5, wherein like numerals represent like components throughout the several Figures, an apparatus 10 is illustrated for the treatment of the surface of an object, such as a silicon wafer 12. The present invention is useful for treating any type of microelectronic device, including but not limited to flat panel displays, hard drives, and multiple chip modules. Additionally, the invention is useful for treating masks used for microlithography processes including x-ray masks, and any semiconductor substrates including but not limited to gallium arsenide wafers or wafers comprised of silicon.

Apparatus 10 basically comprises a movable chuck 14 which supports the silicon wafer 12 within an aerosol chamber 16 and a jet impingement nozzle 18. The apparatus 10 is used for treating a surface 13 of the substrate, e.g. silicon wafer 12; such treatment can be any coating, cleaning, or the like treatment wherein the jet impingement nozzle 18 provides an aerosol, liquid or gas to impinge surface 13. For the purposes of a specific description, the apparatus 10 will be described as an aerosol cleaning apparatus used for cleaning contaminants from the surface of a silicon wafer.

The illustrated chuck 14 is of the type exhibiting a linear movement within a predetermined range to move the entire side of the wafer 12 through the jet impingement stream. The present invention is also applicable to systems utilizing rotational chucks (not shown) whereby rotary movement of the wafer 12 is produced in order to impinge its surface with the jets from the nozzle 18. Alternatively, either a linear or a rotational movement can be imparted to the nozzle 18 in addition to either movement of the chuck or instead of to the chuck while the chuck and the wafer remain stationary to accomplish a similar result. The term chuck is used to mean a device which functionally supports the object to be treated. In the case where the chuck moves linearly or rotationally, the chuck also includes the appropriate slide or guide mechanism or turntable. However, where the chuck is stationary, it may be merely a functional support mechanism.

The present invention is particularly applicable for use as a cryogenic aerosol cleaning chamber used for cleaning contaminants from silicon wafers. As set forth above in the Background section, cryogenic cleaning may use argon aerosols, carbon dioxide, or water, for example. At present, argon aerosols are preferred. Specific examples of argon cryogenic aerosols combined with nitrogen are disclosed in U.S. Pat. Nos. 5,062,898, 5,209,028 and 5,294,261, all to McDermott et al, the entire disclosures of each of which are hereby incorporated by reference.

As shown in FIG. 3, the aerosol chamber 16 defines an enclosed interior space having an exhaust duct 20. Within the aerosol chamber 16, the movable chuck 14 is provided. The movable chuck 14 includes a surface for supporting a silicon wafer 12 thereon and is movably supported so that the surface 13 of the silicon wafer 12 to be treated can be completely moved through the impingement area of the jet impingement nozzle 18. Movable chuck 14 may include any conventional mechanism for securing the silicon wafer 12 to its surface facing jet impingement nozzle 18, such as by vacuum openings that open to the supporting surface for holding the silicon wafer 12 against it. Mechanical fasteners or clips, suction devices, electrostatic devices and electromagnetic devices are known for fastening the wafer to the chuck. These and others may be utilized. The movable chuck 14 is further supported within the aerosol chamber 16 to provide its necessary movement. Conventional slides and guiding mechanisms can be utilized to define the path of movement of the movable chuck 14. Moreover, an actuating mechanism 22, see FIG. 5, may be utilized to impart the movement to the movable chuck 14 along its guidepath. Actuator mechanism 22 may comprise any conventional electric, mechanical, electromechanical, hydraulic, pneumatic, or the like actuator mechanism. The actuator mechanism 22 should have a range of motion sufficient that the surface 13 of silicon wafer 12 can be moved entirely through the impingement area. An actuator rod 24 may be connected between the actuator mechanism 22 and the movable chuck 14, and may also include a vacuum passage for providing the vacuum to the surface of the movable chuck 14 for securing the silicon wafer 12, as discussed above.

Jet impingement nozzle 18 is conventionally supported within the aerosol chamber 16 and includes a series of jet spray openings along the length of the nozzle 18 so that aerosol can be expelled from the jet impinging nozzle 18 to impinge the surface 13 of silicon wafer 12. Jet impingement nozzle 18 may be adjustable so that the angle of the jet impingement stream can be optimized for a particular treatment process. The jet impingement nozzle 18 is connected with a supply line 26, which itself may be further connected with discreet supply lines 28 and 30 connected with the actual gas or liquid supplies of argon, nitrogen, or the like, depending on the specific process. Further processing steps may take place within the supply line 26, again depending on the specific process, so that the jet impingement nozzle 18 expels the desired aerosol, such as a cryogenic cleaning aerosol. Also shown in FIG. 5 is a line 32 which connects from the inside of the aerosol chamber 16 to either a vacuum device or a pressurizing device for controlling the desired air pressure within the aerosol chamber 16 again depending on the specific process. For example, in a cryogenic cleaning apparatus using argon and nitrogen, it may be desirable to reduce a pressure within the aerosol chamber 16 for forming the cryogenic particles.

Ingress and egress to and from the inside of the aerosol chamber 16 can be conventionally provided. Typically, a wafer handling system or robot would be used which is controlled and designed specifically to the guidelines for a particular semiconductor wafer. Such a robot would be responsible for placing and removing wafers from the apparatus. Access would preferably be provided through slots or openings in the end wall on the left, as viewed in FIGS. 3 and 4, in a known manner.

It is a specific purpose of the present invention to control the fluid dynamics within the aerosol chamber 16 to define two separated fluid paths, each of which is separately exhausted from the aerosol chamber 16. To accomplish this, a flow separator 34 is provided to control and define the two separate flow paths extending into the exhaust duct 20. Specifically, according to the illustrated embodiment, the flow separator 34 comprises a baffle plate secured to an end of the movable chuck 14 closest to the exhaust duct 20. A conventional means for securing the flow separator 34 to the chuck 14 are contemplated, including mechanical fastening, adhesives, welding, etc. Alternatively, the flow separator 34 can be formed integrally with the chuck 14 or a portion of the chuck. The flow separator 34 works with the reciprocating movable chuck 14 to define a first exhaust stream A above the movable chuck 14 and the flow separator 34, as shown in FIGS. 3 and 5, and a second exhaust stream B shown below the chuck 14 and flow separator 34. In this case, the flow separator 34 should extend sufficiently into the exhaust duct 20 so that the separate flows of streams of A and B are maintained. Mixing of streams A and B can occur sufficiently downstream. Alternatively, streams A and B can be separately connected with distinct exhaust ducts. The exhaust duct or ducts may further be connected with a vacuum pump to assist in the exhaust flow process.

The flow separator 34 preferably also extends substantially the transverse width of the aerosol chamber 16. Likewise, the movable chuck 14 also preferably extends substantially the transverse width of the aerosol chamber 16. Either or both may be provided to slide within guides or grooves along the sides. As a result, stream A is defined from the jet impingement nozzle 18 over surface 13 of the silicon wafer 12, over flow separator 14, and into the exhaust duct 20. Stream B is defined by aerosol that passes between the jet impingement nozzle 18 and the surface 13 of the silicon wafer 12 and which passes around the leading edge of the silicon wafer 12 and the chuck 14, underneath chuck 14, and underneath the flow separator 34 into exhaust duct 20. A small amount of the aerosol which passes between nozzle 18 and surface 13 of the silicon wafer 12 flows around the jet impingement nozzle 18 as shown by arrow C, and flows back into stream A. The flow designated by arrow C may generate a low pressure area next to nozzle 18 toward the leading edge side of the movable chuck 14 and the silicon wafer 12. However, according to the present invention, the positive flow through stream B is still maintained.

Figure 4:
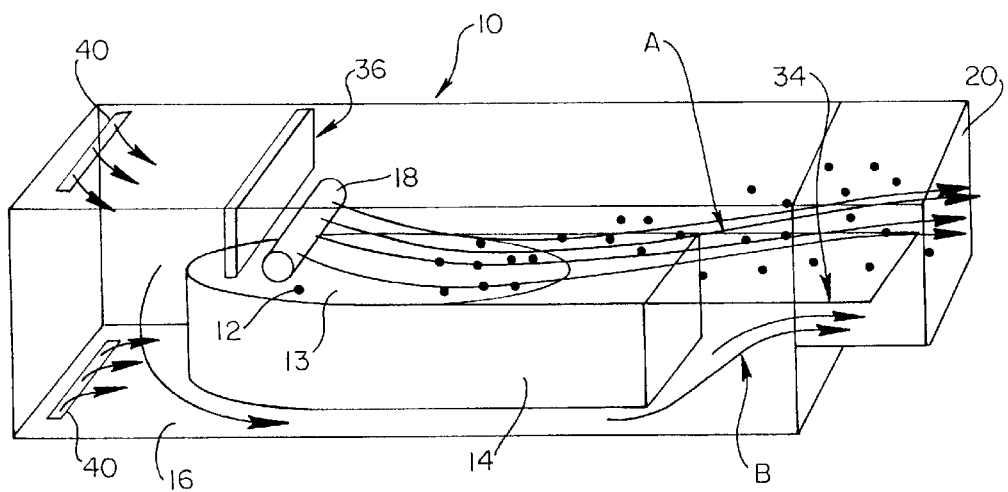
FIG. 4 is a schematic view in perspective in accordance with the present invention showing an aerosol chamber with a split post-impingement outflow, similar to FIG. 3, further provided with a shroud positioned adjacent to the nozzle for restricting current circulation around the nozzle.

As illustrated in FIG. 4, a shroud 36 may additionally be provided to control the flow dynamics within the aerosol chamber 16 by substantially eliminating the stream C discussed above. Preferably, the shroud 36 comprises a plate provided near the jet impingement nozzle 18 on the side thereof toward the leading edge of the movable chuck 14 and silicon wafer 12. More preferably, the shroud 36 is connected to the upper wall of the aerosol chamber 16, extends substantially to the sidewalls of the aerosol chamber 16, and extends downward to near the surface 13 of the silicon wafer 12 as it passes under the jet impingement nozzle 18. The object is to allow the stream B to pass below nozzle 18 and below shroud 36, but to substantially prevent the generation of a stream C back around the nozzle 18. The closer that the shroud 36 is to the nozzle 18, the greater is the effect to minimize stream C. Preferably, the shroud is removably attached to the aerosol chamber 16 so that it can be easily removed and/or replaced. This way, the effect of the shroud can be varied by changing shrouds of different dimensions, particularly as to its extent toward the surface 13.

As illustrated schematically in FIG. 5, a make-up gas, preferably an inert gas such as inert nitrogen, can be introduced into the aerosol chamber 16 at one or more locations by way of supply conduits 38. Although not necessary, such make-up gas is preferably introduced at both the top and bottom of the aerosol chamber 16 near the side thereof away from the exhaust. The reason for the use of the make-up gas is to compensate or make-up for slight pressure deviations (in the order of between about 5–10%) within the aerosol chamber caused by instabilities in the nozzle and pressure controls. By supplying the make-up gas, the effect of any local pressure differentials is minimized and the positive overall pressure flow from the left to the right that is generated by the action of the impingement jets, as illustrated in FIGS. 3–5, is maintained. The make-up gas can be introduced into the aerosol chamber 16 through slots 40 which are illustrated in FIG. 4 through the top and bottom walls of the aerosol chamber 16. Conventional gas supply techniques can be used.

With reference to FIGS. 3 and 4 and in comparison to FIG. 2 discussed above in the Background section, the operation of an aerosol cleaning operation will be described. As discussed above and illustrated in FIG. 2, the present invention is directed to overcoming a recirculation of contaminated exhaust flow back to a cleaned portion of a silicon wafer. As the silicon wafer and chuck are moved from right to left, as illustrated, the left or leading edge is cleaned while contaminant particles are exhausted in the exhaust flow. The described recirculation takes some of the contaminant particles and can potentially redeposit those particles on the cleaned surface portion of the silicon wafer.

As shown in FIG. 3, the cleaning aerosol is directed by the jet impingement nozzle 18 to the surface 13 of the silicon wafer 12. Again, as the chuck and silicon wafer 12 are moved from right to left, as illustrated, the surface 13 of the silicon wafer 12 is cleaned from its leading edge toward the flow separator 34 end of the chuck 14. In this case, the flow separator 34 prevents the contaminated particles within the exhaust flow stream A from passing around the trailing edge of movable chuck 14 to thereby prevent the contaminated particles from being recirculated. Moreover, by the present invention, a positive flow is created between the nozzle 18 and the surface of silicon wafer 12 to go around and below the chuck 14 to define stream B. In other words, by the present invention, the flow separator 34 controls the direction of the contaminated flow within stream A, and also provides a clean aerosol flow over the already cleaned portion of the surface 13 of silicon wafer 12 as stream B. Stream A is the primary exhaust flow while the stream B is sufficient to bring clean aerosol over the already cleaned portion of the silicon wafer 12. Flow about the nozzle 18, described above as stream C, comprises clean aerosol which joins stream A into the exhaust duct 20.

With the shroud 36, shown in FIG. 4, that stream C which flows around the jet impingement nozzle 18 is substantially minimized. The result is the provision of a more positive stream B of clean aerosol over the clean surface portion of the silicon wafer 12 and eventually into the exhaust 20.

Figure 6:
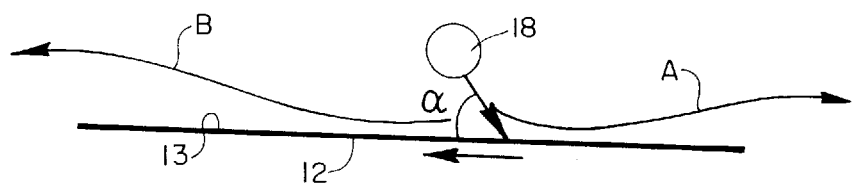
FIG. 6 is a schematic side view of a wafer moving toward the left relative to a net impingement nozzle and showing the angle of impingement of the jet stream and the formation of the split streams in accordance with the present invention.

The positive flow defining streams A and B is illustrated in FIG. 6. In this case, the angle of impingement α is such as to create a desired relative impact velocity between the aerosol and the contaminant particle on the surface 13 as it is being cleaned and translated under the nozzle 18. As shown, the wafer movement is to the left. In accordance with the present invention, the angled α can be modified depending on the specific cleaning process and effect desired. Since positive flow is created in both directions, the angle α can be even 90 degrees or greater. With a system not having the definition of streams A and B, the angle α must be capped relatively low to substantially define the stream of the exhaust flow only in the direction of the exhaust flow. Moreover, in accordance with the present invention with impingement angles α of greater than 90 degrees, it is possible that the wafer movement can be in the opposite direction, that is from the left to the right of FIG. 6. Thus, wafers can be cleaned in either direction. Multiple passes may be conducted for a single wafer cleaning. It may further be desirable to have an exhaust duct provided on the opposite end of the chamber 16 and including mechanisms for opening or closing the respective exhaust ducts depending on the cleaning direction. An additional flow separator 34 can likewise be provided.

The present invention is also applicable to applications having rotational wafer movement. For example, the silicon wafer 12 made to be provided a rotatable chuck within the aerosol chamber 16. The nozzle 18 may extend only partially (i.e. half way) or more across the wafer surface 13. Regardless, the generation of streams A and stream B will prevent recontamination by having the contaminant particles exhausted in the stream A while clean aerosol passes over the cleaned portion and into stream B. With a rotatable chuck, a turntable type device may be provided under the silicon wafer for supporting and rotating it, in which case a surrounding supporting structure to the turntable can support the flow separator 34. Alternatively, the flow separator 34 may be independently supported in place very near the rotating wafer by other means, such as by connection to the walls of the aerosol chamber 16. The shroud 36, discussed above, can also be used in a rotatable chuck system.

Alternative constructions are also contemplated in accordance with the present invention. For example, an aerosol chamber can be designed having a general flow stream that is perpendicular to the surface to be treated. A wafer can be supported on a stationary or movable chuck with its surface horizontal. The aerosol chamber can be set up to have a generally vertical flow stream. Such a system can have a stationary or movable nozzle which together with the chuck controls the impingement over the surface of the wafer to be cleaned. A flow separator plate would extend, for example, from just below the chuck downwardly and into an exhaust duct provided at the lower end of the aerosol chamber. Thus, the post-impingement flow stream can be divided to flow partially over a cleaned region of the wafer surface as well as over the region yet to be cleaned.

Figure 1:
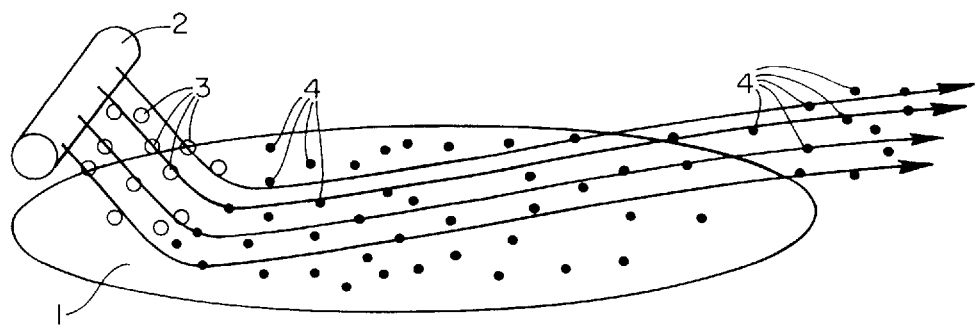
FIG. 1 is a schematic of a typical aerosol cleaning system.
Figure 2:
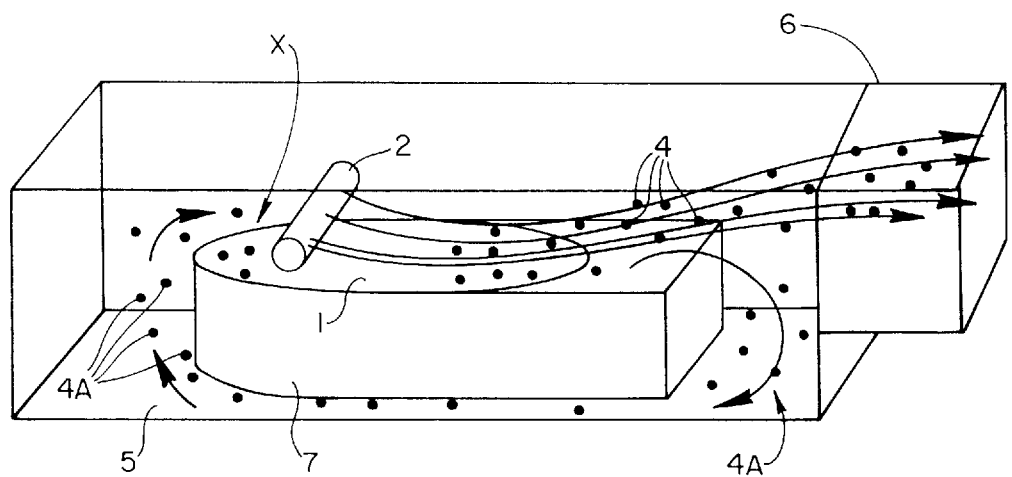
FIG. 2 is a schematic drawing of an aerosol cleaning chamber showing the exhaust flow and potential recirculation problem.

It is further understood that the present invention is applicable to situations where a coating is provided to a surface of a substrate from an aerosol applied by a nozzle. with reference to FIG. 2, an application or coating process could have similar flow dynamics as that shown including a recirculation flow. As a result, some aerosol borne coating particles may travel about the chuck and deposit on the leading side portion of the surface being treated or coated. These additional coating particles can effect the coating thickness provided on the substrate. Clearly, even such a coating apparatus would benefit by the provision and definition of separate post-impingement streams in that the coating thickness can be definitely controlled.

The present invention has been set forth above with reference to several specific embodiments. However, the invention is intended to encompass all alternatives, modifications and variations which fall within the spirit of the invention and the appended claims.

We claim:

1. An apparatus for treating the surface of an object by impinging the surface with an aerosol spray, said apparatus comprising:

an aerosol chamber defining an interior space for receiving an object to be treated within said aerosol chamber;

a nozzle operatively supported within said aerosol chamber for connection with a supply of treatment substance and from which aerosol spray is to be directed;

a chuck operatively supported within said aerosol chamber including means for supporting the object with a surface thereof in a position for treatment, said chuck and said nozzle being relatively movable with respect to one another by a means for causing impingment over an area of the surface of the object, when supported on said chuck, with the aerosol spray;

at least one exhaust from said aerosol chamber through which post-impingement aerosol spray can exit said aerosol chamber; and means for dividing said post-impingement aerosol spray into plural flow streams so that during the treatment of the area of the surface of the object, at least at some point, a first post-impingement stream flows over a portion of the surface yet to be treated, while a second post-impingement stream flows over a portion of the surface already having been treated.

2. The apparatus of claim 1, wherein said means for dividing said post-impingement aerosol spray comprises a flow separator plate that extends from a point adjacent to said chuck toward said exhaust.

3. The apparatus of claim 2, wherein said means for causing impingement over an area of the surface of the object comprises a means for moving said chuck with respect to said nozzle and said aerosol chamber.

4. The apparatus of claim 3, wherein said means for moving said chuck moves said chuck linearly generally along a line of direction defined between said nozzle and said exhaust.

5. The apparatus of claim 4, wherein said flow separator comprises a plate that is fixed to a portion of said chuck that faces said exhaust.

6. The apparatus of claim 5, wherein both of said first and second post-impingement streams flow within a single exhaust duct as directed by said flow separator that extends within said exhaust duct over a least a portion of the movement of said chuck.

7. The apparatus of claim 6, wherein said flow separator extends within said exhaust duct over the entire range of movement of said chuck.

8. The apparatus of claim 6, further including a shroud operatively supported in position within said aerosol chamber to the side of said nozzle but further away from said exhaust than said nozzle.

9. The apparatus of claim 1, further including a shroud operatively supported in position within said aerosol chamber to the side of said nozzle but further away from said exhaust than said nozzle.

10. The apparatus of claim 1, wherein said nozzle is adjustably operatively supported within said aerosol chamber so that an angle of impingement of the aerosol spray can be varied.

11. The apparatus of claim 1, further including at least one make-up gas supply conduit connected to said aerosol chamber for supplying an inert gas into the interior space thereof.

12. An apparatus for cleaning the surface of a semiconductor wafer by impinging the surface with a cryogenic aerosol spray, said apparatus comprising:

an aerosol chamber defining an interior space for receiving a semiconductor wafer to be cleaned within said aerosol chamber;

a nozzle operatively supported within said aerosol chamber for connection with a supply of cleaning substance and from which cryogenic aerosol spray is to be directed;

a chuck operatively supported within said aerosol chamber including means for supporting the semiconductor wafer with a surface thereof in a position for treatment, said chuck and said nozzle being relatively movable with respect to one another by a means for causing impingment over an area of the surface of the wafer, when supported on said chuck, with the aerosol spray;

an exhaust from said aerosol chamber through which post-impingement aerosol spray can exit said aerosol chamber; and means for dividing said post-impingement aerosol spray into plural flow streams so that during the treatment of the area of the surface of the wafer, at least at some point, a first post-impingement stream flows over a portion of the surface of the wafer yet to be treated, while a second post-impingement stream flows over a portion of the surface of the wafer already having been treated.

13. The apparatus of claim 12, wherein said means for dividing said post-impingement aerosol spray comprises a flow separator plate that extends from a point adjacent to said chuck toward said exhaust.

14. The apparatus of claim 13, wherein said means for causing impingement over an area of the surface of the wafer comprises a means for moving said chuck with respect to said nozzle and said aerosol chamber.

15. The apparatus of claim 14, wherein said means for moving said chuck moves said chuck linearly generally along a line of direction defined between said nozzle and said exhaust.

16. The apparatus of claim 15, wherein said flow separator comprises a plate that is fixed to a portion of said chuck that faces said exhaust.

17. The apparatus of claim 16, wherein both of said first and second post-impingement streams flow within a single exhaust duct as directed by said flow separator that extends within said exhaust duct over a least a portion of the movement of said chuck.

18. The apparatus of claim 17, wherein said flow separator extends within said exhaust duct over the entire range of movement of said chuck.

19. The apparatus of claim 17, further including a shroud operatively supported in position within said aerosol chamber to the side of said nozzle but further away from said exhaust than said nozzle.

20. The apparatus of claim 12, further including a shroud operatively supported in position within said aerosol chamber to the side of said nozzle but further away from said exhaust than said nozzle.

21. The apparatus of claim 12, wherein said nozzle is adjustably operatively supported within said aerosol chamber so that an angle of impingement of the aerosol spray can be varied.

22. The apparatus of claim 12, further including at least one make-up gas supply conduit connected to said aerosol chamber for supplying an inert gas into the interior space thereof.

23. A method of treating a surface of an object by jet impingement with an aerosol comprising:

supporting the object on a chuck within an aerosol chamber of the type including a jet impingement nozzle and the chuck, the nozzle and the chuck being operatively supported within the aerosol chamber to be relatively movable with respect to one another, and an exhaust from the aerosol chamber through which post-impingement aerosol can exit the aerosol chamber;

supplying treatment substance to the nozzle, spraying an aerosol jet stream from the nozzle and impinging the aerosol jet stream against the surface of the object;

relatively moving the chuck and nozzle with respect to one another and thereby treating an area over at least a portion of the surface of the object by aerosol jet impingement; and while treating the area over at least a portion of the surface of the object, dividing the post-impingement aerosol flow into a first post-impingement stream that flows over a portion of the surface of the object yet to be treated and a second post-impingement stream that flows over a portion of the surface already having been treated.

24. The method of claim 23, wherein the chuck is movably disposed within the aerosol chamber and the treating of an area of the surface of the object is caused by moving the chuck.

25. The method of claim 23, wherein said step of dividing the post-impingement aerosol flow comprises providing a flow separator plate that extends from a point adjacent to the chuck toward the exhaust.

26. The method of claim 25, further comprising the step of exhausting the post-impingement flow from the aerosol chamber through the exhaust.

27. The method of claim 26, further comprising providing a single exhaust duct and exhausting both the first and second post-impingement streams into the exhaust duct with the flow separator plate extended partially within the exhaust duct.

28. The method of claim 23, further comprising restricting flow of aerosol from the second post-impingement stream around the nozzle and into the first post-impingement stream by providing a shroud within the aerosol chamber in a position to the side of the nozzle but further away from the exhaust than the nozzle.

29. The method of claim 23, comprising a method of cleaning a semiconductor wafer supported by the chuck within the aerosol chamber by spraying a cryogenic cleaning aerosol jet stream over the entire surface of the semiconductor wafer.

30. The method of claim 23, further including the step of providing an inert make-up gas into the aerosol chamber during the treatment of the area of the object.

* * * * *